United States Patent
Pidutti et al.

(10) Patent No.: US 12,101,083 B2
(45) Date of Patent: Sep. 24, 2024

(54) HIGH SPEED DRIVER FOR HIGH FREQUENCY DCDC CONVERTER

(71) Applicant: Infineon Technologies AG, Neubiberg (DE)

(72) Inventors: Albino Pidutti, Villach (AT); Andrea Baschirotto, Tortona (IT); Roberto Di Lorenzo, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 218 days.

(21) Appl. No.: 17/807,799

(22) Filed: Jun. 20, 2022

(65) Prior Publication Data

US 2022/0407406 A1  Dec. 22, 2022

(30) Foreign Application Priority Data

Jun. 21, 2021  (DE) .......................... 102021116029.4

(51) Int. Cl.
*H03K 17/042* (2006.01)
*H02M 3/157* (2006.01)
*H02M 1/08* (2006.01)

(52) U.S. Cl.
CPC ...... *H03K 17/04206* (2013.01); *H02M 3/157* (2013.01); *H02M 1/08* (2013.01)

(58) Field of Classification Search
CPC ................. H03K 17/04; H03K 17/042; H03K 17/04206; H02M 1/08
See application file for complete search history.

(56) References Cited

U.S. PATENT DOCUMENTS

| | | | |
|---|---|---|---|
| 10,666,144 B1 * | 5/2020 | Xie | ..................... H02M 3/1582 |
| 2014/0055190 A1 | 2/2014 | Kaneko et al. | |
| 2016/0268907 A1 * | 9/2016 | Chen | ................. H02M 3/33507 |
| 2018/0316273 A1 * | 11/2018 | Chen | ................. H02M 3/33523 |
| 2021/0282241 A1 * | 9/2021 | Gao | ....................... H02M 3/156 |

* cited by examiner

*Primary Examiner* — Gary L Laxton
(74) *Attorney, Agent, or Firm* — Slater Matsil, LLP

(57) ABSTRACT

A gate driver circuit includes a pulse generator that receives an input signal and generates a pulse signal in response to a switch-on command included in the input signal. The pulse signal has a pulse with a pulse length that is dependent on a level of a pulse control signal. The circuit further includes a sampling circuit that samples an output voltage subsequent to the pulse and stores a respective sampled value, and a controller that receives the sampled value of the output voltage and a reference voltage and updates the level of the pulse control signal based on the sampled value and the reference voltage. A driver circuit generates the output voltage based on the pulse signal.

12 Claims, 4 Drawing Sheets

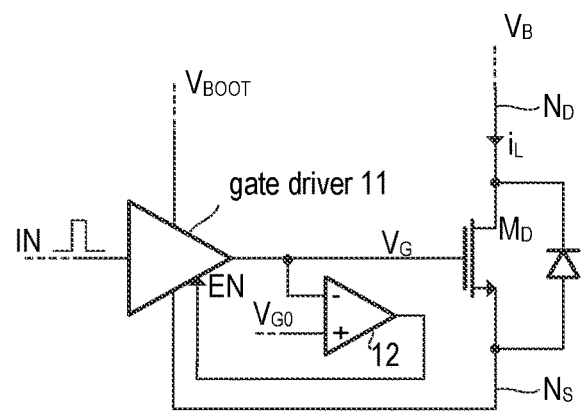
Fig. 4  (will not work due to comparator delay)
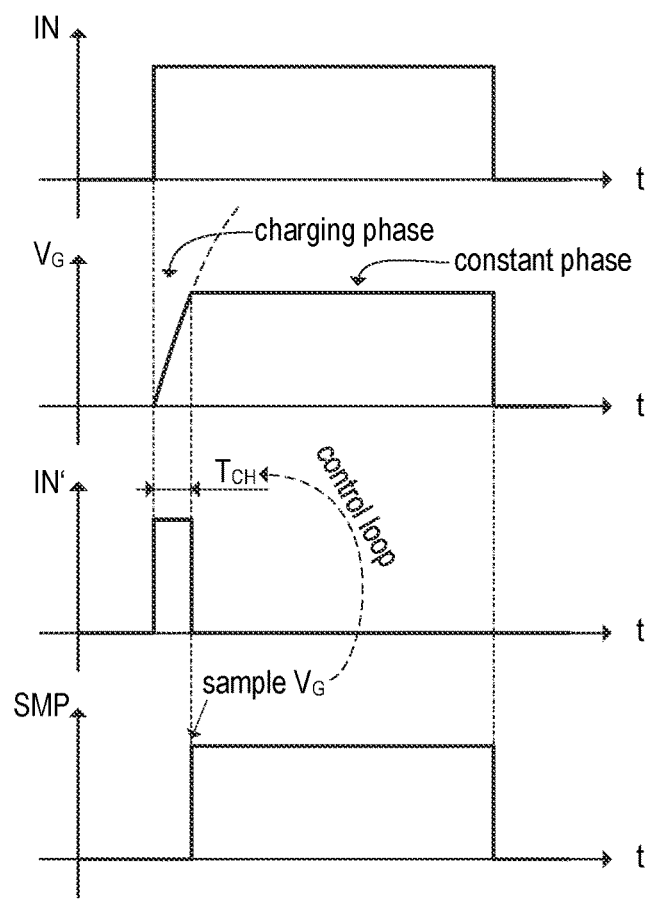
Fig. 5

HIGH SPEED DRIVER FOR HIGH FREQUENCY DCDC CONVERTER

This application claims the benefit of German Patent Application No. 102021116029.4, filed on Jun. 21, 2021, which application is hereby incorporated herein by reference.

TECHNICAL FIELD

This disclosure relates to the field of gate driver circuits. Embodiments described herein particularly relate to driver circuits used to drive the gate of a MOS transistor which may be used, for example, in a switching converter.

BACKGROUND

A large variety of gate driver circuits for Metal-Oxide-Semiconductor (MOS) transistors is known. Generally, gate driver circuits (or short gate drivers) can be optimized with regard to a specific desired switching behavior. In some applications a short switching time (i.e., a fast switching) is an important design goal for gate drivers.

In switching power supply applications such as, for example, in DC/DC switching converters a higher switching frequency allows to reduce the size of the reactive circuit components (capacitors and inductors), which may be desirable for various reasons (size, costs, etc.). A high switching frequency requires a correspondingly high-speed switching of the power transistors used in the switching converters, wherein the gate driver is crucial for the achievable switching speed. This disclosure deals with improved driver circuits that allow a fast switching of MOS transistors.

SUMMARY

A gate driver circuit is described herein. In accordance with one embodiment the circuit includes a pulse generator that is configured to receive an input signal and to generate a pulse signal in response to a switch-on command included in the input signal. The pulse signal has a pulse with a pulse length that is dependent on a level of a pulse control signal. The circuit further includes a sampling circuit that is configured to sample an output voltage subsequent to the pulse and to store a respective sampled value and a controller that is configured to receive the sampled value of the output voltage and a reference voltage and to update the level of the pulse control signal based on the sampled value and the reference voltage. A driver circuit is configured to generate the output voltage based on the pulse signal.

Another embodiment relates to a method for driving a transistor gate. Accordingly, the method includes generating a pulse signal in response to a switch-on command included in an input signal, wherein the pulse signal has a pulse with a pulse length that is dependent on a level of a pulse control signal. The method further includes generating an output voltage based on the pulse signal using a driver circuit, sampling the output voltage subsequent to the pulse and storing a respective sampled value. The level of the pulse control signal us updated based on the sampled value and a reference voltage value.

BRIEF DESCRIPTION OF THE DRAWINGS

In the following detailed description, reference is made to the accompanying drawings. The drawings form a part of the description and, for the purpose of illustration, show examples of how the invention may be used and implemented. It is to be understood that the features of the various embodiments described herein may be combined with each other, unless specifically noted otherwise.

FIG. 4 illustrates one approach that might be obvious but that will not work in practical applications;

FIG. 5 illustrates timing diagrams illustrating, by way of example, the operation principle of the embodiments described herein;

DETAILED DESCRIPTION OF ILLUSTRATIVE EMBODIMENTS

Figure 1:
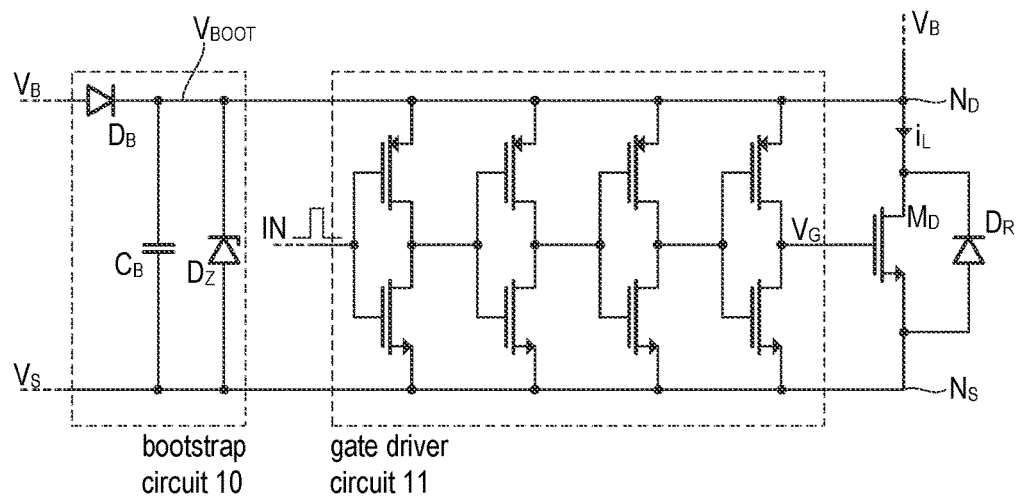
FIG. 1 illustrates one common implementation of a gate driver circuit for driving a high-side transistor.

FIG. 1 illustrates one common implementation of a gate driver circuit for driving a high-side transistor. In the present example, the high-side transistor is a power transistor (e.g., a DMOS transistor) denoted as $M_D$. The diode $D_R$ coupled in parallel to the transistors drain-source current path represents the transistor's intrinsic body diode, which is always present in most semiconductor fabrication technologies. The gate driver circuit 11 includes a series of CMOS inverter circuits, wherein the input signal IN, applied to the input of the driver circuit is a logic signal, which is basically forwarded to the power transistor's gate electrode. When the power transistor $M_D$ is switched on, the source voltage $V_S$ (at circuit node $N_S$) will be close to the drain voltage $V_B$ of the transistor $M_D$ and, therefore, the supply voltage $V_{BOOT}$ for the gate driver 11 needs to be shifted to a voltage level higher than the drain voltage $V_B$ applied to the power transistor $M_D$. This is usually accomplished by a so-called boot-strap circuit.

In the present example the boot-strap circuit 10 includes a series circuit composed of rectifier diode $D_B$ and capacitor $C_B$, wherein the series circuit is coupled between a circuit node providing the supply voltage $V_B$ and circuit node $N_S$. The capacitor $C_B$ is charged while the transistor $M_D$ is off and the circuit node $N_S$ is pulled to lower voltage levels (e.g., close to ground). The capacitor $C_B$ is charged up to a voltage $V_{BOOT}$ which is limited by the Zener voltage of Zener diode $D_Z$ coupled in parallel to the capacitor $C_B$. When the transistor $M_D$ is switched on, the circuit node $N_S$ is pulled close to the supply voltage $V_S$ and the rectifier diode $D_B$ becomes reverse biased (and blocking) which the capacitor $C_B$ still can provide the supply voltage $V_{BOOT}$ to the gate driver 11. Various implementations of boot-strap circuits are known and are thus not further discussed herein.

Figure 2A:
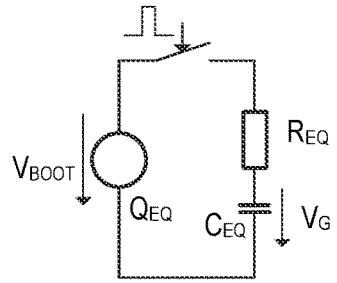
FIG. 2(a) illustrates an equivalent circuit of the driver circuit and a timing diagram.
Figure 2B:
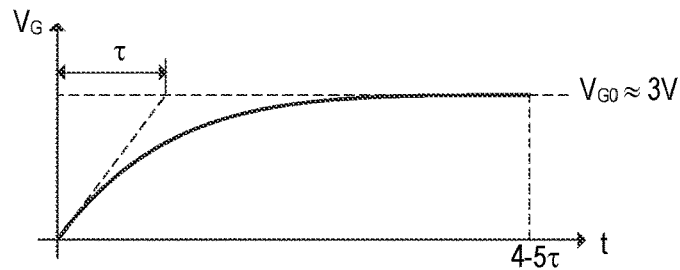
FIG. 2(b) illustrates the charging process of the transistor gate.

FIG. 2(a) illustrates an equivalent circuit of the gate driver circuit and the transistor gate connected thereto. The transistor gate is represented by the capacitance $C_{EQ}$, which is basically determined by the gate capacitance of the power transistor $M_D$. The resistor $R_{EQ}$ coupled in series to the capacitor $C_{EQ}$ represents the effective output resistance of the gate driver circuit 11, and the voltage source represents the voltage $V_{BOOT}$ provided by the capacitor $C_B$ shown in FIG. 1. For further discussion, we assume the capacitor $C_{EQ}$ is discharged. When the switch SW is closed, the voltage $V_{BOOT}$ is applied to the series circuit of resistor $R_{EQ}$ and capacitor $C_{EQ}$ causing the capacitor $C_{EQ}$ to be charged. FIG. 2(b), illustrates a timing diagram of the voltage $V_G$ across the capacitor $C_{EQ}$, which corresponds to the gate-source voltage in the circuit of FIG. 1. The equivalent circuit of FIG. 2(a) is a first-order low pass having a time constant of $\tau = R_{QE}C_{EQ}$. It takes usually a time of $4\tau$ to $5\tau$ to charge the gate capacitance $C_{EQ}$ to a level $V_{Go}$ (approximately 3V in the current example) that is sufficiently high to drive the transistor into its low-ohmic state (on-resistance $R_{ON}$ of transistor $M_D$). The level $V_{Go}$ basically corresponds to the bootstrap voltage $V_{BOOT}$. The embodiments described herein aim at shortening the charging time to significantly shorter time spans.

Figure 3:
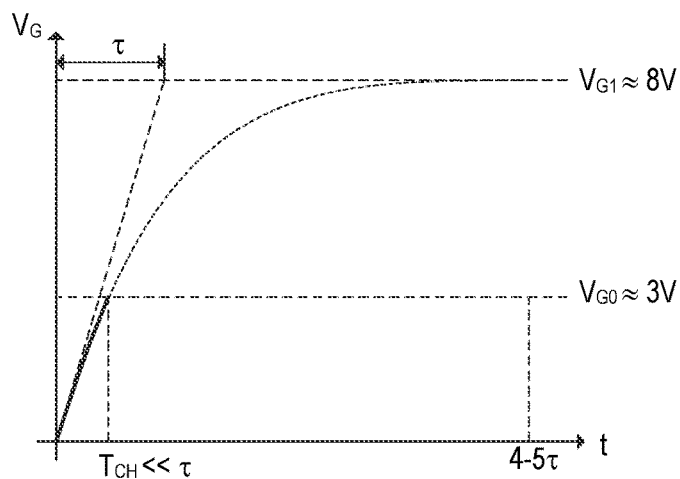
FIG. 3 illustrates, in a schematic timing diagram, the charging process of a transistor gate when using a driver circuit according to the embodiments described herein.

The timing diagram in FIG. 3 illustrates how the charging curve if FIG. 2(b) changes if the bootstrap voltage $V_{BOOT}$ is increased from $V_{Go}$ to $V_{G1}$, which is approximately 8 V in the present example. Due to the higher bootstrap voltage $V_{BOOT}$, the$_{gate}$ voltage $V_G$ reaches the target level of $V_{Go}$ in significantly less time. In the depicted example, the level $V_{Go}$ s reached in a charging time of $T_{CH}$ which can be significantly lower than the time constant $\tau$. The problem with increasing the bootstrap voltage to, e.g., 8 V is that the charging process must be reliably interrupted as soon as the target level of 3V is reached. Otherwise the gate oxide of the power transistor may be destroyed.

One straight-forward approach to limit the gate voltage to a target voltage $V_{Go}$ significantly lower than the bootstrap voltage $V_{BOOT}$ is illustrated in FIG. 4. The circuit of FIG. 4 basically corresponds to the circuit of FIG. 1 with an additional comparator 12, which is configured to compare the gate voltage $V_G$ present at the transistor's gate electrode with the desired target voltage $V_{Go}$ (wherein $V_{Go} < V_{BOOT}$) and detect the gate voltage $V_G$ reaching the target level $V_{Go}$. If this is the case, the comparator triggers disables the gate driver 11 thus stopping the charging process of the gate capacitance. Unfortunately, in practice, the approach shown in FIG. 4 will not work for most applications because of the comparator delay and the propagation delay within the gate driver 11. During this delay time, the gate voltage will rise to levels above the target voltage which can damage the gate oxide of the power transistor $M_D$.

The embodiments described below use an approach different from the approach illustrated in FIG. 4 to reliably limit the gate voltage $V_G$ to the desired target voltage $V_{Go}$ while using significantly higher bootstrap voltages (e.g., 8 V or higher). The concept is first explained using the timing diagrams of FIG. 5. The first diagram (top) of FIG. 5 illustrates the control signal IN, which can be regarded as the input signal of the gate driver circuit. The signal IN is a logic signal indicating (e.g., by a high signal level for a time interval $T_{ON}$) the desired switching state of the power transistor $M_D$. The rising edge of the signal IN triggers the process of charging the gate capacitance of the power transistor $M_D$.

However, the gate capacitance is not charged for the whole time interval $T_{ON}$ but only for a short time interval $T_{CH}$, which is indicated by a high level of signal IN' (see third diagram (from the top) of FIG. 5). The time intervals $T_{ON}$ and $T_{CH}$ begin at the same time instant, wherein $T_{CH}$ is only a fraction of $T_{ON}$. As can be seen in the second diagram of FIG. 5, the gate voltage $V_G$ rises during the time interval $T_{CH}$ (as the charge stored in the gate capacitor increases), whereas the gate voltage $V_G$ remains basically constant after the time interval $T_{CH}$ during the remaining part of the time interval $T_{ON}$. At the end of the time interval $T_{ON}$ (on-time) the gate capacitor is discharged (e.g., by connecting the gate electrode to the source electrode of the power transistor by a low-ohmic current path and, consequently, the transistor is switched off.

The time $T_{CH}$ is adjustable and is initially set to a default value small enough to ensure that the gate voltage $V_G$ will not exceed the target value $V_{Go}$ even if the combination of the actual parameters $V_{BOOT}$, $R_{EQ}$ and $C_{EQ}$ (cf. FIGS. 2(a) and 2(b)), which may vary due to tolerances, represent a worst case (bootstrap voltage at the higher end and the time constant $R_{EQ}C_{EQ}$ at the lower end). At the end of the charging time $T_{CH}$ the actual voltage level at the gate electrode is sampled, e.g., using a sample and hold circuit. The sampling time instant is determined by the rising edge of the signal SMP, which may immediately follow after the falling edge of the signal IN' (see fourth (bottom) diagram of FIG. 5). The time $T_CH$ can then be adjusted based on the sampled gate voltage level. If the sampled value is lower than the target value $V_{Go}$, then the time $T_{CH}$ is increased by a specific amount so that, in the next switching cycle, the gate is charged to a somewhat higher level as in the preceding cycle. Conversely, if the sampled value is higher than the target value $V_{Go}$, then the time $T_{CH}$ is decreased. If the sampled value equals the target level $V_{Go}$, then the time $T_{CH}$ may remain unchanged.

Figure 6:
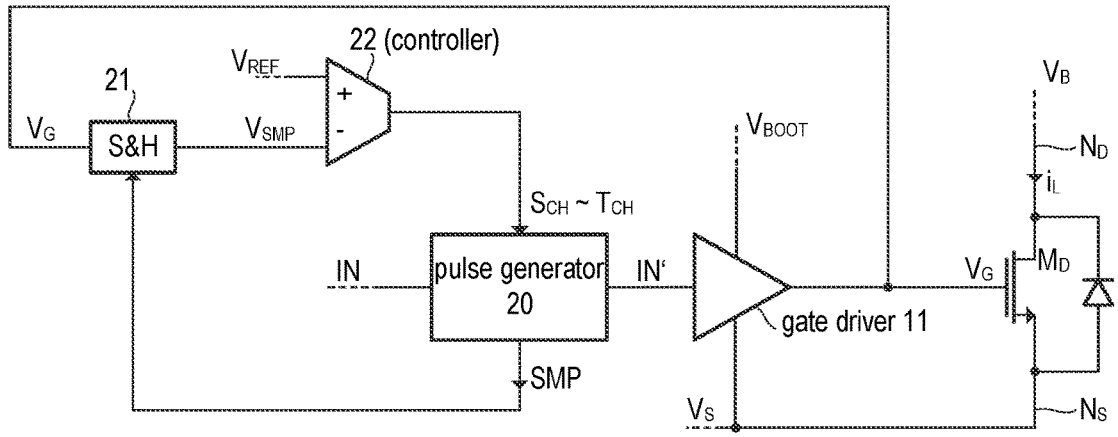
FIG. 6 illustrates one example implementation of a gate driver circuit in accordance with one embodiment.

On exemplary implementation of the concept explained above is illustrated in FIG. 6 (gate control circuit boo). FIG. 6 shows the power MOS transistor $M_D$ whose drain-source current path is coupled between the circuit nodes ND (connected to drain) and $N_S$ (connected to source). The supply voltage $V_B$ is applied to the node ND. An impedance (load, not shown) may be connected between node $N_S$ and a reference potential (e.g., ground). Similar to FIG. 1, the gate driver 11 is supplied by the bootstrap voltage $V_{BOOT}$, wherein the floating potential at node $N_S$ is the reference potential for the gate driver circuit 11. Different from the circuit of FIG. 1, the pulse signal IN' is supplied to the input of the gate driver 11, which produces a corresponding output signal. As shown in FIG. 5, the signal IN includes, in each switching cycle, a short pulse with an adjustable pulse length $T_{CH}$. According to the example of FIG. 6, a pulse generator 20 is configured to receive the input signal IN (cf., FIG. 5) and to generate the pulse signal IN' in response to a rising edge if the input signal IN, wherein the pulse length $T_{CH}$ is dependent on a level of a pulse control signal $S_{CH}$. It is noted that, in the present example, the rising edge of the input signal IN serves as a switch-on command, which initiates the process of switching-on the transistor $M_D$. Other types of switch-on commands (e.g., a falling edge, a specific digital word received via a serial communication link, etc.) may be used dependent on the actual application.

The example of FIG. 6 further includes a sampling circuit 21 that is configured to sample the gate voltage $V_G$ generated by the gate driver 11 subsequent to the pulse (i.e., after the time interval $T_{CH}$, see FIG. 5) and to store a respective sampled value $V_{SMP}$. A controller 22 is configured to receive the sampled value $V_{SMP}$ and a reference voltage $V_{REF}$ (that represents the desired target gate voltage) and to update the level of the pulse control signal $S_{CH}$ based on the sampled value $V_{SMP}$ and the reference voltage $V_{REF}$. In the depicted embodiment, the controller is basically a difference amplifier which amplifies the difference $V_{REF} - V_{SMP}$. This means basically a P-controller. However, other types of controllers may be used in other embodiments. If, in one switching cycle, the gate voltage $V_G$—and thus the sampled value $V_{SMP}$—is lower than the reference value $V_{REF}$, then the pulse control signal $S_{CH}$ will be adjusted to increase the time $T_{CH}$ in the next switching cycle, which will result in a higher gate voltage $V_G$. Similarly, if the gate voltage $V_G$—and thus the sampled value $V_{SMP}$—is higher than the reference value $V_{REF}$, then the pulse control signal $S_{CH}$ will be adjusted to decrease the time $T_{CH}$ in the next switching cycle, which will result in a lower gate voltage $V_G$. In steady state with continuously repeating switching cycles, the gate voltage $V_G$ will approximately be equal to the reference voltage value $V_{REF}$.

Before being updated for the first time, the level of the pulse control signal $S_{CH}$ is at a predetermined initial level. The initial level may be used to generate the first pulse in response to the first switch-on command after a startup (power-on) of the circuit.

Figure 7:
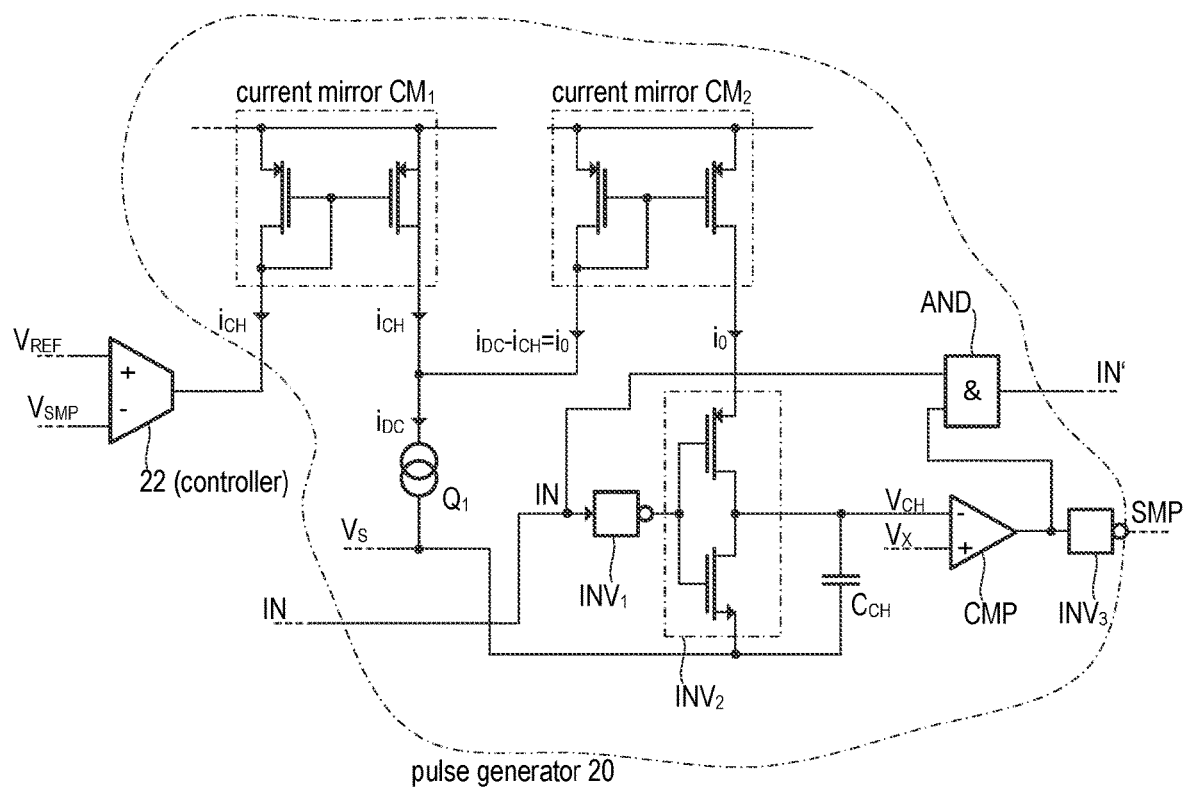
FIG. 7 illustrates one exemplary implementation of the pulse generator used in the example of FIG. 6 in more detail.

FIG. 7 illustrates one example implementation of the pulse generator circuit 20 in more detail. In the depicted example, it is assumed that the controller 22 has a current output like, for example, a transconductance amplifier. The controller 22 sinks a current $i_{CH}$ at its output, wherein the current $i_{CH}$ depends on the difference $V_{REF}-V_{SMP}$. The higher the difference $V_{REF}-V_{SMP}$, the higher the current $i_{CH}$ at the output of controller 22. The current $i_{CH}$ is "mirrored" to another current path by a first current mirror $CM_1$. That is the current $i_{CH}$ passes though the input path of current mirror CAC that is coupled to the output of the controller 22, wherein the output current path of current mirror CAC provides the mirrored current, which may be equal to the current in the input path. A current sink $Q_1$ is connected to the output of the current mirror CAC and configured to sink a constant DC current $i_{DC}$. Further, the input path of a second current mirror $CM_2$ is connected to the output of the first current mirror $CM_1$. Following Kirchhoff's current law, the current $i_o$ passing through the input path of the second current mirror $CM_2$ must equal $i_{DC}$ minus $i_{CH}$ ($i_o=i_{DC}-i_{CH}$). The input current $i_o$ of current mirror $CM_2$ is mirrored to the output of the current mirror $CM_2$.

An inverter $INV_2$ is supplied by the output current $i_o$ of the second current mirror $CM_2$ and accordingly, the current $i_o=i_{DC}-i_{CH}$ is the maximum output current of the inverter $INV_2$ when the inverter output is at a high level. Another inverter $INV_1$ is connected ahead of the inverter $INV_2$. Accordingly, the inverter chain $INV_1$ and $INV_2$ does not change the logic state of the input signal IN supplied to the inverter $INV_1$ in a steady state, but the output current of the inverter chain is limited to the current level $i_o$. A capacitor $C_{CH}$ is coupled to the output of inverter $INV_2$. Accordingly, upon with a rising edge in input signal IN the capacitor $C_{CH}$ is charged with the current $i_o$. The resulting capacitor voltage $V_{CH}$ will ramp up until it reaches approximately the supply voltage of the inverter $INV_2$ (approximately $V_{BOOT}$ minus the voltage drop in current mirror $CM_2$).

The capacitor voltage $V_{CH}$ (voltage ramp) is compared with a reference voltage $V_X$ by comparator CMP, which is configured to signal (e.g., by a low level at its output) that the capacitor voltage $V_{CH}$ has exceeded the reference voltage $V_X$. The comparator output voltage is used to blank the input voltage IN using an AND gate which receives, as input signals, the input signal IN and the comparator output signal. The output signal of the AND gate is denoted as IN' (see also FIG. 5). The signal IN' follows the input signal IN before it is blanked by the comparator output signal a time $T_{CH}$ after the rising edge of the input signal. The time $T_{CH}$ depends in the current $i_o$ and the capacitance $C_{CH}$, wherein the current $i_o$ depends on the controller output current $i_{CH}$. If the controller output current $i_{CH}$ increases, the current $i_o$ will decrease and, consequently, the capacitor $C_{CH}$ is charged more slowly and the time $T_{CH}$ increases. The time $T_{CH}$ is the pulse length of the pulse in signal IN' triggered by a (rising edge in input signal IN, see FIG. 5). The inverted comparator output signal (inverter $INV_3$) is provided as output signal SMP that triggers the sampling circuit 21 as explained above. Accordingly, the pulse length $T_{CH}$ is determined by the controller output current $i_{CH}$ and thus by the sampled voltage value $V_{SMP}$, wherein at the end of the pulse a new value is samples.

It is noted that FIG. 6 illustrates a concept for charging the gate capacitance in order to switch the power transistor $M_D$ on. The circuitry for discharging the gate capacitance in order to switch the power transistor $M_D$ off is not shown in order to keep the drawings simple. However, known concepts may be used to switch off the power transistor $M_D$ such as, for example, an electronic switch (e.g., another transistor) configured to electrically connect gate and source electrode of the power transistor $M_D$ in response to a falling edge of the input signal IN. Of course, gate and source electrode of power transistor $M_D$ need to be disconnected at or before the next rising edge of the input signal IN in order to allow another switch-on.

Figure 8:
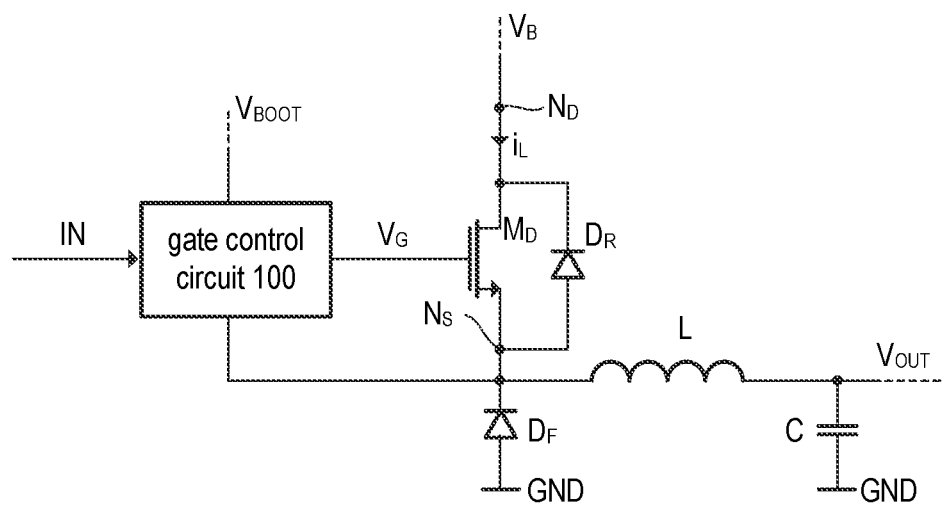
FIG. 8 illustrates one exemplary application of the gate driver circuit of FIG. 6.

FIG. 8 illustrates one exemplary application of the gate control circuit 100 of FIGS. 6 and 7. In essence, FIG. 8 illustrates a buck converter circuit. The gate control circuit 100 and the high-side power transistor 100 have already explained with reference to FIG. 4. An inductor L is connected between the source terminal of power transistor $M_D$ and an output circuit node, at which the output voltage $V_{OUT}$ is provided. A capacitor $C_{OUT}$ is connected between the output node and ground GND. Further, a free-wheeling diode $D_F$ is connected between the source terminal of transistor $M_D$ and ground GND. A low side DMOS transistor may be used instead of the diode $D_F$. Embodiments of the gate control circuit 100 described herein allow a faster switching and thus a reduction of the inductance and, consequently, a reduction of the inductor size.

Although the invention has been illustrated and described with respect to one or more implementations, alterations and/or modifications may be made to the illustrated examples without departing from the spirit and scope of the appended claims. For example, inverted logic levels can be used, and logic operations such as AND, NAND, OR, etc. can generally be replaced by different logic operations using commonly known concepts. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

What is claimed is:
1. An electronic circuit comprising:
   a pulse generator configured to receive an input signal and to generate a pulse signal in response to a switch-on command included in the input signal, the pulse signal having a pulse with a pulse length that is dependent on a level of a pulse control signal;

a sampling circuit configured to sample an output voltage subsequent to the pulse and to store a respective sampled value;

a controller configured to receive the sampled value of the output voltage and a reference voltage and to update the level of the pulse control signal based on the sampled value and the reference voltage; and a driver circuit configured to generate the output voltage based on the pulse signal.

2. The electronic circuit of claim 1, wherein the pulse control signal has a predetermined initial level before being updated for a first time.

3. The electronic circuit of claim 2, wherein the initial level is set to such a level, that a resulting pulse length is short enough that the generated output voltage is below a predefined maximum voltage value.

4. The electronic circuit of claim 1, wherein the driver circuit operably receives a supply voltage that is higher than a predetermined maximum voltage value.

5. The electronic circuit of any of claim 1, wherein the driver circuit includes an output resistor.

6. The electronic circuit of claim 1, wherein the pulse generator uses the updated level when generating a subsequent pulse in response to a subsequent switch-on command included in the input signal.

7. The electronic circuit of claim 1, wherein the sampling circuit is configured to store the sampled value in a first capacitor, the sampled value being represented by a respective capacitor voltage.

8. The electronic circuit of claim 1, wherein the controller comprises a differential amplifier configured to output, as pulse control signal, a signal representing a difference between the sampled value and the reference voltage.

9. The electronic circuit of claim 1, wherein the pulse control signal is a control current, and wherein the pulse generator is configured to generate a ramp signal with a steepness depending on the control current, the pulse length being determined by a time at which a level of the ramp signal reaches a reference value.

10. A switching converter comprising:

a power transistor having a gate electrode and a load terminal coupled to an inductor, wherein the gate electrode is coupled to the electronic circuit of claim 1 so that the output voltage of the circuit is applied to the gate electrode.

11. A method comprising:

generating a pulse signal in response to a switch-on command included in an input signal, the pulse signal having a pulse with a pulse length that is dependent on a level of a pulse control signal;

generating an output voltage based on the pulse signal;

sampling the output voltage subsequent to the pulse and storing a respective sampled value; and updating the level of the pulse control signal based on the sampled value and a reference voltage.

12. The method of claim 11, wherein generating the pulse signal comprises:

generating a ramp signal with a steepness depending on the pulse control signal, the pulse length being determined by a time at which a level of the ramp signal reaches a reference value.

* * * * *